United States Patent [19]

Baba

[11] Patent Number: 4,542,307
[45] Date of Patent: Sep. 17, 1985

[54] DOUBLE BOOTSTRAPPED CLOCK BUFFER CIRCUIT

[75] Inventor: Fumio Baba, Kawasaki, Japan

[73] Assignee: Fujitsu Limited, Kawasaki, Japan

[21] Appl. No.: 535,835

[22] Filed: Sep. 26, 1983

[30] Foreign Application Priority Data

Sep. 28, 1982 [JP] Japan ................... 57-169054

[51] Int. Cl.$^4$ .................... H03K 17/06; H03K 19/096
[52] U.S. Cl. .................... 307/482; 307/443;
307/481; 307/269; 307/270
[58] Field of Search ............... 307/443, 453, 481, 482,
307/548, 577, 578, 269, 270, 449

[56] References Cited

U.S. PATENT DOCUMENTS

| | | | |
|---|---|---|---|
| 3,714,466 | 1/1973 | Spence | 307/270 X |
| 3,778,784 | 12/1973 | Karp et al. | 307/449 X |
| 3,898,479 | 8/1975 | Proebsting | 307/269 X |
| 3,937,983 | 2/1976 | Reed | 307/270 X |
| 3,988,617 | 10/1976 | Price | 307/453 |
| 4,049,979 | 9/1977 | Shieu et al. | 307/482 X |
| 4,354,123 | 10/1982 | Eaton, Jr. | 307/264 X |
| 4,431,927 | 2/1984 | Eaton, Jr. et al. | 307/269 |
| 4,494,018 | 1/1985 | Clemen et al. | 307/482 |

FOREIGN PATENT DOCUMENTS 0063935  4/1982  Japan ................. 307/482

OTHER PUBLICATIONS

Sonoda, "MOSFET Powering Circuit", IBM Tech. Disc. Bull., vol. 13, No. 9, Feb. 1971, p. 2658.
Arzubi et al., "Bootstrap Driver Stage", IBM Tech. Disc. Bull., vol. 23, No. 9, Feb. 1981, pp. 4185-4186.

Primary Examiner—Stanley D. Miller
Assistant Examiner—D. R. Hudspeth
Attorney, Agent, or Firm—Staas & Halsey

[57] ABSTRACT

A buffer circuit has first and second boot-strap circuits. The first boot-strap circuit charges the gate of an output MOS transistor to a voltage above a supply voltage when an input signal has a first logic level. The gate of a precharging MOS transistor in the first boot-strap circuit is driven by the second boot-strap circuit so as to precharge a capacitor in the first boot-strap circuit to a voltage above the supply voltage when the input signal has a second logic level.

6 Claims, 4 Drawing Figures

DOUBLE BOOTSTRAPPED CLOCK BUFFER CIRCUIT

BACKGROUND OF THE INVENTION

1. Field of the Invention

The present invention relates to a buffer circuit for amplifying input signals such as clock signals.

2. Description of the Prior Art

A known buffer circuit used in integrated semiconductor circuits, e.g., in a clock generator in memory devices, charges the gate of an output metal oxide semiconductor (MOS) transistor to a voltage above a supply voltage $V_{CC}$ so that an output signal OUT thereof rises rapidly to a voltage equal to $V_{CC}$.

A boot-strap circuit is in general provided in such a buffer circuit to charge the gate of the output MOS transistor to the high voltage. The boot-strap circuit in the buffer circuit according to prior art, however, does not have sufficient charging capacity.

SUMMARY OF THE INVENTION

It is an object of the present invention to provide an improved buffer circuit with an increased reset efficiency and a faster rising output signal.

The above object is achieved by a buffer circuit which includes: first and second output MOS transistors connected in series between a supply voltage and ground; an output terminal connected between the first and second output MOS transistors and a first boot-strap circuit connected to the gate of the first output MOS transistor. The first boot-strap circuit charges the gate of the first output MOS transistor to a voltage above the supply voltage when an input signal has a first logic level, thus turning on the first output MOS transistor and charging the output terminal to the supply voltage. The first boot-strap circuit includes a capacitor and a MOS transistor which precharges the capacitor. Also included in the buffer circuit is a second boot-strap circuit having an output node connected to the gate of the precharging MOS transistor in the first boot-strap circuit, for driving the gate of the precharging MOS transistor to a precharged voltage above the supply voltage when the input signal is a second logic level.

According to the present invention as described above, since the gate of the precharging MOS transistor in the first boot-strap circuit is driven by the second boot-strap circuit to precharge the capacitor in the first boot-strap circuit to a voltage above the supply voltage during a certain time, the reset efficiency of the buffer circuit can be increased and the rising speed of the output signal can be increased. Furthermore, according to the present invention, these effects can be obtained by just adding a simple circuit to the prior buffer circuit.

BRIEF DESCRIPTION OF THE DRAWINGS

The above and other related objects and features of the present invention will be apparent from the description of the present invention set forth below, with reference to the accompanying drawings, wherein.

DESCRIPTION OF THE PREFERRED EMBODIMENTS

Figure 1:
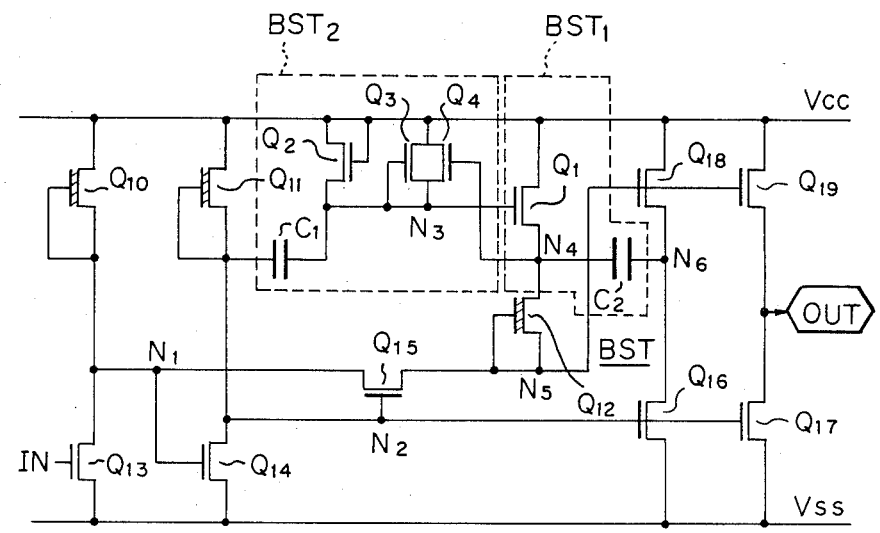
FIG. 1 is a circuit diagram of an embodiment of the present invention.

Referring to FIG. 1 which illustrates an embodiment of the present invention, reference symbol $BST_1$ indicates a first boot-strap circuit and $BST_2$ indicates a second boot-strap circuit which is added according to the present invention.

First, the operation of a conventional buffer circuit without the second boot-strap circuit $BST_2$ and, thus, with the gate of transistor $Q_1$ directly connected to the supply voltage $V_{CC}$ will be discribed. In FIG. 1, $Q_{10}$ to $Q_{12}$ indicate depletion-mode MOS transistors and $Q_1$ to $Q_4$ and $Q_{13}$ to $Q_{19}$ indicate enhancement-mode MOS transistors. The MOS transistor $Q_1$ and a capacitor $C_2$ comprise the first boot-strap circuit $BST_1$.

Figure 2:
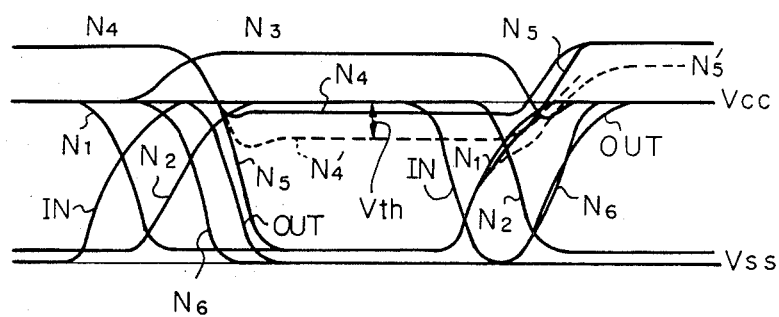
FIG. 2 is a waveform diagram for explaining the operation of the embodiment of FIG. 1.

When an input signal IN applied to the gate of the MOS transistor $Q_{13}$ rises from a low logic level to a high logic level, the MOS transistor $Q_{13}$ turns on and, thus, node $N_1$ is discharged to a low logic level as shown in FIG. 2. As a result, the MOS transistor $Q_{14}$ turns off and node $N_2$ is pulled up to $V_{CC}$ by the MOS transistor $Q_{11}$, causing the MOS transistors $Q_{15}$ to $Q_{17}$ to turn on. As the MOS transistor $Q_{16}$ turns on, node $N_6$ is discharged to a low logic level or ground $V_{SS}$. Also, as the MOS transistor $Q_{17}$ turns on, the output terminal OUT is discharged to ground $V_{SS}$. Furthermore, since the MOS transistor $Q_{15}$ turns on, current flows from $V_{CC}$ to $V_{SS}$ via $Q_1$—$N_4$—$Q_{12}$—$N_5$—$Q_{15}$—$N_1$—$Q_{13}$, which causes node $N_5$ to be discharged to a low logic level and the MOS transistors $Q_{18}$ and $Q_{19}$ to turn off.

Node $N_4$ is boot-strapped by the capacitor $C_2$ to a voltage above $V_{CC}$ when the MOS transistor $Q_{16}$ is off, namely when the input signal IN has a low logic level. When the MOS transistor $Q_{16}$ turns on, node $N_4$ is lowered to a voltage equal to the supply voltage $V_{CC}$ minus one threshold voltage $V_{th}$ of the MOS transistor $Q_1$. The capacitor $C_2$ is precharged during the turning on of $Q_{16}$. A broken line $N_4'$ in FIG. 2 shows the voltage at node $N_4$ according to the above-described conventional circuit. Since node $N_4$ is below $V_{CC}$ by the amount of the threshold voltage $V_{th}$ when the input signal IN has the high logic level, node $N_5$ is not charged to a sufficiently high voltage by the capacitor $C_2$ via the boot-strapping node $N_4$ when the input signal IN falls to a low logic level. At this time (low IN signal) node $N_1$ is charged to a high logic level, node $N_2$ is discharged to a low logic level, the transistor $Q_{14}$ turns on, and the transistors $Q_{15}$ to $Q_{17}$ turn off, causing the voltage at node $N_6$ to increase. A broken line $N_5'$ shown in FIG. 2 shows the voltage at node $N_5$. The voltage $N_5'$ at node $N_5$ causes the MOS transistor 19 to turn on. If the voltage $N_5'$ at node $N_5$ is not sufficiently high, although the voltage $N_5'$ is higher than $V_{CC}$, the output signal OUT will not increase to $V_{CC}$ or it will take a lot of time to increase the output signal to $V_{CC}$.

Hereinafter, the operation of the buffer circuit according to the embodiment illustrated in FIG. 1 will be described. The present invention is intended to sufficiently increase the voltage at node $N_4$ during the period when the input signal IN has a high logic level, hereinafter called the "reset period". In order to perform this operation, this embodiment of the present invention provides the second boot-strap circuit $BST_2$, whose output node $N_3$ is connected to the gate of the MOS transistor $Q_1$. A boot-strapping capacitor $C_1$ in the second boot-strap circuit BST$_2$ is connected between node N$_2$ and the output node N$_3$. It should be noted that node N$_2$ is maintained at a high logic level during the reset period. Thus, during the reset period, the gate of the MOS transistor Q$_1$ (node N$_3$) is charged to a voltage above V$_{CC}$ via the capacitor C$_1$, causing node N$_4$ to be charged to a voltage below but near V$_{CC}$ via the transistor Q$_1$ during the reset period, as shown by a solid line N$_4$ in FIG. 2.

When the input signal IN falls to a low logic level from a high logic level, the voltage at node N$_2$ changes from a high logic level to a low logic level and thus node N$_3$ is discharged to a voltage below V$_{CC}$, causing the transistor Q$_1$ to turn off. At the same time, the MOS transistor Q$_{16}$ turns off, causing the voltage at node N$_6$ to increase. As a result, node N$_4$ is boot-strapped via the capacitor C$_2$ to a voltage above V$_{CC}$, and thus node N$_5$ is charged to a voltage above V$_{CC}$, as shown by the solid line N$_5$ in FIG. 2. This charged voltage at node N$_5$ is sufficiently high to drive the MOS transistors Q$_{18}$ and Q$_{19}$ and to rapidly raise the output signal OUT to V$_{CC}$. The MOS transistor Q$_1$ is in the on-state to cause the charging of capacitor C$_2$ via V$_{CC}$—Q$_1$—N$_4$—C$_2$—Q$_{16}$—V$_{SS}$ when the voltage at node N$_3$ is above V$_{CC}$. When the transistor Q$_{14}$ turns on the voltage at N$_2$ drops and the transistor Q$_{16}$ turns off, thus as N$_3$ becomes $\leq$V$_{CC}$ and N$_4$ becomes $<$V$_{CC}$, the MOS transistor Q$_1$ turns off, whereby node N$_4$ is prevented from being discharged to V$_{CC}$.

Besides the boot-strapping capacitor C$_1$ and the enhancement-mode MOS transistor Q$_2$ connected as a diode for precharging the capacitor C$_1$, the second boot-strap circuit BST$_2$ preferably includes the enhancement-mode MOS transistor Q$_3$ connected as a diode between node N$_3$ and V$_{CC}$. The transistor Q$_3$, whose drain and gate are connected to node N$_3$ and whose source is connected to V$_{CC}$, prevents node N$_3$ from being over-charged. In other words transistor Q$_3$ clamps node N$_3$ to a voltage which is higher than V$_{CC}$ by a predetermined voltage. As a result, if V$_{CC}$ decreases when the output signal OUT rises, since the maximum voltage at node N$_3$ decreases depending upon V$_{CC}$, the transistor Q$_1$ will not turn on, causing node N$_4$ not to discharge to V$_{CC}$.

In addition, the second boot-strap circuit BST$_2$ preferably includes the MOS transistor Q$_4$, which is connected between node N$_3$ and V$_{CC}$ and controlled by the voltage at node N$_4$. This transistor Q$_4$ prevents node N$_4$ from being over-charged and also ensures cutting off operation of the transistor Q$_1$. The transistor Q$_1$ should be cut off during a period when the voltage at node N$_4$ is above V$_{CC}$. Therefore, if the transistor Q$_4$ is conductive during this period, the voltage at node N$_3$ is clamped to V$_{CC}$. As a result, the transistor Q$_1$ will remain turned off even if V$_{CC}$ drops.

Figure 3:
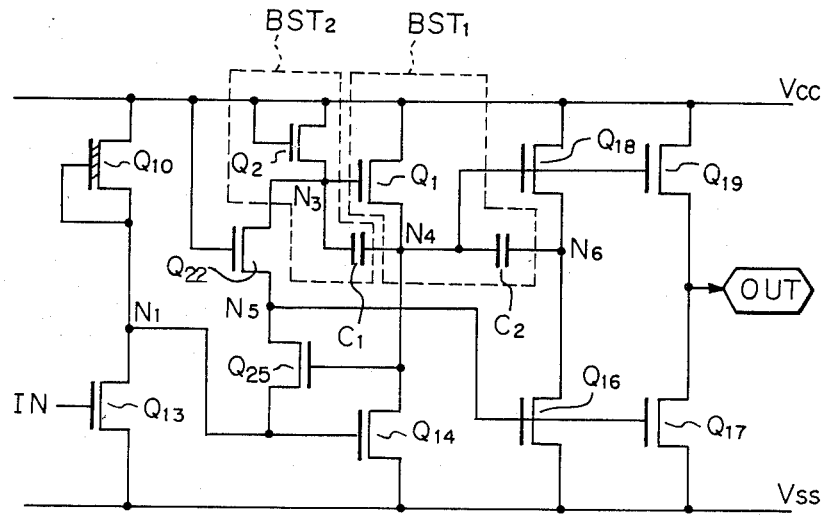
FIG. 3 is a circuit diagram of another embodiment of the present invention.

FIG. 3 illustrates another embodiment of the present invention. In this embodiment, the drain of the MOS transistor Q$_{14}$ is connected to node N$_4$ and furthermore to the gates of the transistors Q$_{18}$ and Q$_{19}$. The bootstrapping capacitor C$_1$ in the second boot-strap circuit BST$_2$ is connected between node N$_4$ and node N$_3$. The drain (node N$_5$) of the MOS transistor Q$_{25}$ is connected to the gates of the MOS transistors Q$_{16}$ and Q$_{17}$. Node N$_5$ is also connected via the MOS transistor Q$_{12}$ to node N$_3$. The remainder of this embodiment is essentially the same as that of the embodiment of FIG. 1.

Hereinafter the operation of the buffer circuit according to the embodiment of FIG. 3 will be described.

Figure 4:
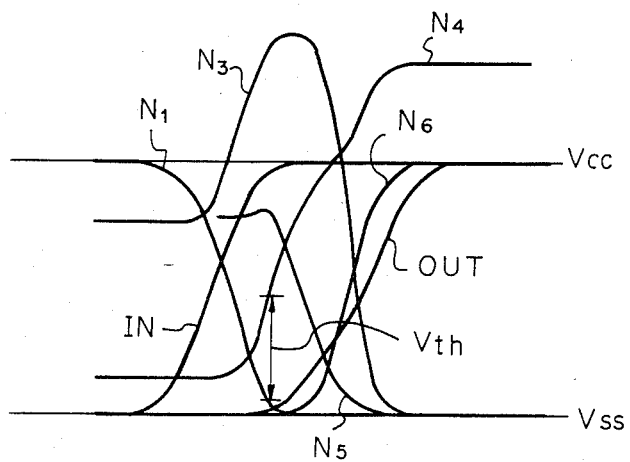
FIG. 4 is a waveform diagram for explaining the operation of the embodiment of FIG. 3.

When the input signal IN rises to a high logic level from a low logic level, the MOS transistor Q$_{13}$ turns on and thus node N$_1$ is gradually discharged to V$_{SS}$ as shown in FIG. 4. As a result, the MOS transistor Q$_{14}$ turns off and thus node N$_4$ is charged via Q$_{14}$ causing the voltage at node N$_3$ to be boot-strapped by the capacitor C$_1$ to a voltage well above the supply voltage V$_{CC}$ as shown in FIG. 4. Therefore, the MOS transistor Q$_1$ is maintained in the on-state and node N$_4$ is charged nearly to V$_{CC}$. When node N$_4$ is charged to a voltage equal to the voltage at node N$_1$ plus one threshold voltage V$_{th}$, the MOS transistor Q$_{25}$ turns on causing node N$_5$ to be discharged as shown in FIG. 4. Thus the enhancement-type MOS transistor Q$_{22}$ also turns on causing node N$_3$ to rapidly discharge. Accordingly, the MOS transistors Q$_1$, Q$_{16}$ and Q$_{17}$ turn off. Since, in this case, the MOS transistor Q$_{18}$ is in the on-state, node N$_6$ is boot-strapped to a voltage near to V$_{CC}$. As a pulse-shaped voltage produced by boot-strapping is applied to node N$_4$ via the capacitor C$_2$, node N$_4$ is boot-strapped to a voltage well above V$_{CC}$. This charged voltage at node N$_4$ is sufficiently high to drive the MOS transistors Q$_{18}$ and Q$_{19}$ and to rapidly raise the output signal OUT to V$_{CC}$. Since the MOS transistor Q$_1$ is in off-state in this case, node N$_4$ can be prevented from being discharged to V$_{CC}$.

Many widely different embodiments of the present invention may be constructed without departing from the spirit and scope of the present invention. It should be understood that the present invention is not limited to the specific embodiments described in this specification, except as defined in the appended claims.

I claim:

1. A buffer circuit, operatively connected to a supply voltage and to receive an input signal, producing an output signal in response to the input signal, comprising:
    first and second output transistors having their drain-source current paths operatively connected in series between the supply voltage and ground, thereby forming a junction between said first and second output transistors, each of said first and second output transistors having a gate;
    an output terminal operatively connected to the junction between said first and second output transistors;
    a first boot-strap circuit operatively connected to the gate of said first output transistor for charging the gate of said first output transistor to a charged voltage above the supply voltage when the input signal has a first logic level, turning on said first output transistor and charging said output terminal to the supply voltage, said first boot-strap circuit comprising:
      a capacitor operatively connected to the gate of said first output transistor; and
      a precharging transistor, having its drain-source current path coupled between the supply voltage and said capacitor, for precharging said capacitor and having a gate; and
    a second boot-strap circuit having an output node operatively connected to the gate of said precharging transistor in said first boot-strap circuit, for driving the gate of said precharging transistor to a precharged voltage above the supply voltage when the input signal has a second logic level.

2. A buffer circuit as claimed in claim 1, wherein said second boot-strap circuit comprises a capacitor, operatively connected to the output node, which is precharged when the input signal has the first logic level.

3. A buffer circuit as claimed in claim 1, wherein said second boot-strap circuit further comprises diode means, operatively connected to the supply voltage and the output node, for clamping the output node to a precharge voltage which is higher than the supply voltage by a predetermined voltage.

4. A buffer circuit as claimed in claim 3, wherein said diode means comprises a clamping transistor having a gate and a drain operatively connected to the output node and a source operatively connected to the supply voltage.

5. A buffer circuit as claimed in claim 1, wherein said first boot-strap circuit further comprises a junction node between said precharging transistor and said capacitor, and wherein said second boot-strap circuit comprises clamping means operatively connected to the supply voltage and the junction node, for maintaining the output node at the supply voltage when the junction node between said precharging transistor and said capacitor in said first boot-strap circuit is above the supply voltage.

6. A buffer circuit as claimed in claim 5, wherein said clamping means comprises a clamping transistor having a source operatively connected to the output node, a drain operatively connected to the supply voltage and a gate operatively connected to the junction node.

* * * * *

UNITED STATES PATENT AND TRADEMARK OFFICE
CERTIFICATE OF CORRECTION

PATENT NO. : 4,542,307

DATED : September 17, 1985

INVENTOR(S) : Baba

It is certified that error appears in the above-identified patent and that said Letters Patent is hereby corrected as shown below:

Column 3, line 27, "$<V_{cc},$" should be --$>V_{cc},$--.

Column 4, line 59, "saidcapacitor" should be --said capacitor--.

Signed and Sealed this

Twenty-fourth Day of November, 1987

*Attest:*

DONALD J. QUIGG

*Attesting Officer*      *Commissioner of Patents and Trademarks*